US011355615B2

(12) United States Patent
Min et al.

(10) Patent No.: US 11,355,615 B2
(45) Date of Patent: Jun. 7, 2022

(54) FINFET HAVING FLUORINE-DOPED GATE SIDEWALL SPACERS

(71) Applicant: Taiwan Semiconductor Manufacturing Co., Ltd., Hsinchu (TW)

(72) Inventors: Wei-Lun Min, Hsinchu (TW); Chang-Miao Liu, Hsinchu (TW); Xu-Sheng Wu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 2 days.

(21) Appl. No.: 16/745,347

(22) Filed: Jan. 17, 2020

(65) Prior Publication Data

US 2021/0226030 A1 Jul. 22, 2021

(51) Int. Cl.
*H01L 29/49* (2006.01)
*H01L 29/78* (2006.01)
(Continued)

(52) U.S. Cl.
CPC .... *H01L 29/4983* (2013.01); *H01L 21/26586* (2013.01); *H01L 21/28512* (2013.01); *H01L 21/31155* (2013.01); *H01L 21/76224* (2013.01); *H01L 21/76834* (2013.01); *H01L 21/823468* (2013.01); *H01L 29/0653* (2013.01); *H01L 29/41791* (2013.01); *H01L 29/6656* (2013.01); *H01L 29/66545* (2013.01); *H01L 29/66795* (2013.01); *H01L 29/785* (2013.01); *H01L 29/7851* (2013.01)

(58) Field of Classification Search
CPC ..... H01L 21/823431; H01L 21/823821; H01L 21/845; H01L 27/0886; H01L 27/0924; H01L 27/1211; H01L 27/10826; H01L 27/10879; H01L 29/41791; H01L 29/66795–66818; H01L 29/785–7856; H01L 2029/7857–7858; H01L 2924/13067; H01L 29/42384–42392; H01L 29/0673; H01L 29/4983; H01L 29/6653; H01L 29/6656; H01L 29/66545; H01L 29/66553; H01L 21/823468; H01L 21/823864; H01L 21/3115; H01L 21/31155; H01L 21/26586
See application file for complete search history.

(56) References Cited

U.S. PATENT DOCUMENTS 6,255,703 B1 * 7/2001 Hause ............... H01L 21/28518
257/382
6,420,220 B1 * 7/2002 Gardner ............ H01L 21/28052
257/E21.199

(Continued)

*Primary Examiner* — Younes Boulghassoul
(74) *Attorney, Agent, or Firm* — JCIPRNET

(57) ABSTRACT

Field effect transistor and manufacturing method thereof are disclosed. The field effect transistor includes a substrate, fins, a gate structure, a first spacer and a second spacer. The fins protrude from the substrate and extend in a first direction. The gate structure is disposed across and over the fins and extends in a second direction perpendicular to the first direction. The first spacer is disposed on sidewalls of the gate structure. The second spacer is disposed on the first spacer and surrounds the gate structure. The first spacer is fluorine-doped and includes fluorine dopants.

15 Claims, 8 Drawing Sheets

(51) Int. Cl.
*H01L 29/06* (2006.01)
*H01L 29/417* (2006.01)
*H01L 29/66* (2006.01)
*H01L 21/3115* (2006.01)
*H01L 21/762* (2006.01)
*H01L 21/285* (2006.01)
*H01L 21/8234* (2006.01)
*H01L 21/265* (2006.01)
*H01L 21/768* (2006.01)

(56) References Cited

U.S. PATENT DOCUMENTS

| | | | |
|---|---|---|---|
| 6,720,213 B1 * | 4/2004 | Gambino | H01L 21/26506 438/184 |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 2005/0260819 A1 * | 11/2005 | Belyansky | H01L 29/6656 438/305 |
| 2006/0220152 A1 * | 10/2006 | Huang | H01L 29/7833 257/408 |
| 2011/0031538 A1 * | 2/2011 | Hsieh | H01L 29/7833 257/288 |
| 2017/0186623 A1 * | 6/2017 | Posseme | H01L 21/2236 |
| 2017/0207324 A1 * | 7/2017 | Huang | H01L 29/66803 |
| 2019/0006242 A1 * | 1/2019 | Wang | H01L 21/26506 |
| 2019/0006487 A1 * | 1/2019 | Huang | H01L 21/02057 |
| 2019/0067129 A1 * | 2/2019 | Weng | H01L 29/66545 |
| 2019/0148501 A1 * | 5/2019 | Chen | H01L 29/41725 257/288 |
| 2019/0148510 A1 * | 5/2019 | Chien | H01L 29/785 257/192 |
| 2019/0157419 A1 * | 5/2019 | Huang | H01L 21/30617 |
| 2019/0206999 A1 * | 7/2019 | Xu | H01L 21/02532 |
| 2020/0020567 A1 * | 1/2020 | Sun | H01L 21/266 |
| 2020/0066851 A1 * | 2/2020 | Mehandru | H01L 21/0262 |

* cited by examiner

FINFET HAVING FLUORINE-DOPED GATE SIDEWALL SPACERS

BACKGROUND

The progress of semiconductor integrated circuit (IC) manufacturing involves the increase of functional density (i.e., the number of interconnected devices per chip area) and the diminution of geometry size. This scaling down process creates huge challenges in both fabrication and design and leads to the development of three-dimensional designs, such as fin field-effect transistors (FinFETs).

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A shows a schematic perspective view of the structure produced using the manufacturing method of a FinFET according to some embodiments of the present disclosure. The cross-sectional views of FIG. 1B and FIG. 1C are taken along the lines I-I', II-II' shown in FIG. 1A.

FIG. 1F shows a schematic perspective view of the structure produced using the manufacturing method of a FinFET according to some embodiments of the present disclosure. The cross-sectional view of FIG. 1G is taken along the line II-II' shown in FIG. 1F.

FIG. 1H' shows a schematic top view of a portion of the structure of FIG. 1H.

DETAILED DESCRIPTION

Figure 1A:
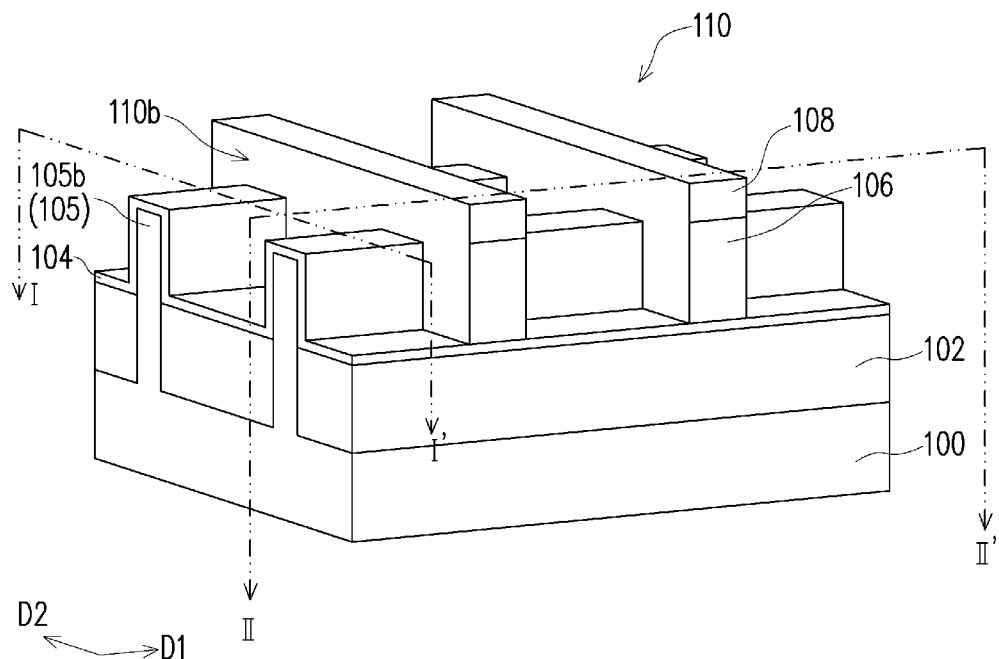
FIG. 1A to FIG. 1J show schematic perspective and cross-sectional views of a structure produced during a manufacturing method of a FinFET according to some embodiments of the present disclosure.

The following disclosure provides many different embodiments, or examples, for implementing different features of the provided subject matter. Specific examples of components and arrangements are described below to simplify the disclosure. These are, of course, merely examples and are not intended to be limiting. For example, the formation of a second feature over or over a first feature in the description that follows may include embodiments in which the second and first features are formed in direct contact, and may also include embodiments in which additional features may be formed between the second and first features, such that the second and first features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The embodiments of the disclosure describe the exemplary manufacturing process of FinFETs and the FinFETs fabricated there-from. In certain embodiments of the disclosure, the FinFET may be formed on bulk silicon substrates. Still, the FinFET may be formed on a silicon-on-insulator (SOI) substrate, a germanium-on-insulator (GOI) substrate, a SiGe substrate, or a Group III-V semiconductor substrate. Also, in accordance with some embodiments of the disclosure, the silicon substrate may include other conductive layers or other semiconductor elements, such as transistors, diodes or the like. The embodiments are not limited in this context. Other transistor structures, such as gate-all-around (GAA) field effect transistors, are within the contemplated scope of the disclosure. The field effect transistor may be included in a microprocessor, memory cell, and/or other integrated circuits (IC). In addition, the transistors of the present disclosure may be further processed using CMOS technology processing. Accordingly, it is understood that additional processes may be provided before, during, and after the illustrated method, and that some other processes may only be briefly described herein. Also, the structures illustrated in the drawings are simplified for a better understanding of the concepts of the present disclosure. For example, although the figures illustrate the structure of a field effect transistor, it is understood the field effect transistor may be part of an IC that further includes a number of other devices such as resistors, capacitors, inductors, fuses, etc.

Figure 1B:
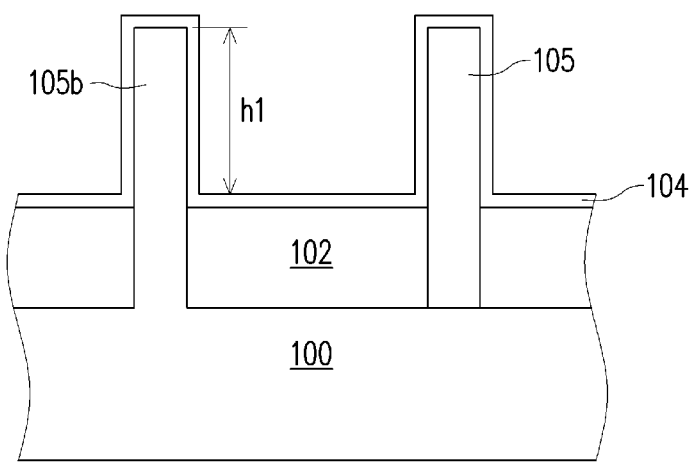
Figure 1C:
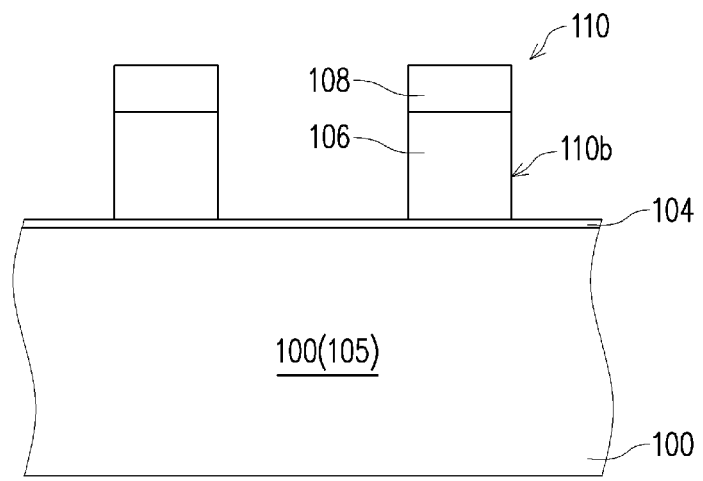

FIG. 1A to FIG. 1J show schematic cross-sectional views of a structure produced during a manufacturing method of a FinFET 10 according to some embodiments of the present disclosure. FIG. 1A shows a schematic perspective view of the structure produced using the manufacturing method of a FinFET according to some embodiments of the present disclosure. The cross-sectional views of FIG. 1B and FIG. 1C are taken along the lines I-I', II-II' shown in FIG. 1A.

Referring to FIG. 1A, in some embodiments, a semiconductor substrate 100 is provided, and the semiconductor substrate 100 includes a crystalline semiconductor material substrate. In some embodiments, the semiconductor material substrate includes a crystalline silicon substrate or a bulk silicon substrate (e.g., wafer). The semiconductor substrate 100 may include various doped regions depending on design requirements (e.g., p-type semiconductor substrate or n-type semiconductor substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively, configured for a p-type FinFET. In some alternative embodiments, the semiconductor substrate 100 may be made of a suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In some embodiments, the semiconductor substrate 100 includes a silicon on insulator (SOI) substrate.

As shown in FIG. 1A and FIG. 1B, fins 105 are formed on and/or in the semiconductor substrate 100. In some embodiments, portions of the substrate 100 are removed to form trenches and to define the fins 105 protruding from the substrate 100. In some embodiments, the fins 105 are formed from the substrate 100 and the fins 105 and the semiconductor substrate are an integral piece without boundary between the substrate 100 and the individual fins 105. That is, the substrate 100 and the fins 105 are made of a same material. However, other techniques for fabricating the fins 105 may be used and the fins 105 may be formed of a different material and formed on the semiconductor substrate 100. In some embodiments, multiple fins 105 are arranged in parallel and extend along a first direction D1. In some embodiments, the height and spacing of the fins 105 may be adjusted according to production and design requirements.

In some embodiments, as shown in FIG. 1A and FIG. 1B, isolation structures 102 are formed between the fins 105. In some embodiments, the isolation structures 102 are shallow trench isolation (STI) structures. The isolation structures 102 are interposed between adjacent fins 105. The isolation structures 102 may be formed by filling the trenches defined by adjacent fins 105 with a dielectric material. In some embodiments, the isolation structures 102 may include a multi-layered structure, such as a thermal oxide liner layer filled with silicon nitride or silicon oxide. In some embodiments, a pad layer 104 is formed over the semiconductor substrate 100 and covers the isolation structures 102 and the fins 105. In some embodiments, the pad layer 104 is formed by blanketly depositing an oxide layer over the substrate 100 or by thermal oxidation. As shown in FIG. 1B, after the formation of the isolation structures 102, the fins 105 are still remained protruded out of the isolation structures 102, and the height h1 of the protruded portions 105b of the fins 105 protruding from the top surfaces of the isolation structures 102 is considered the effective height of the fins 105 (i.e. fin height).

Referring to FIG. 1A and FIG. 1C, stack structures 110 are formed over the substrate 100, across the fins 105 (over the protruded portions 105b of the fins 105) and on the isolation structures 102. In some embodiments, the stack structures 110 are located directly on the pad layer 104 and on the isolation structures 102. In FIG. 1B and FIG. 1C, two fins and two stack structures are shown, and it is understood that the number(s) of the fin(s) and/or stack structure(s) is merely for illustrative purposes but may be more or less than two, depending on the designs of the device structure of the present disclosure. In some embodiments, in FIG. 1A, the stack structures 110 are strip-shaped and arranged in parallel, and the extending direction D2 of the strip-shaped stack structures is perpendicular to the extending direction D1 of the fins 105. For example, the stack structure 110 comprises a polysilicon strip 106 and a hard mask strip 108 located on the polysilicon strip 106. As shown in FIG. 1A, the protruded portions 105b of the fins 105 that are wrapped by the stack structures 110 function as channel regions of the FinFET 10. In some embodiments, the stack structure 110 is formed by depositing a polysilicon layer (not shown), forming a hard mask layer (not shown) over the polysilicon layer and then patterning the hard mask layer and the polysilicon layer to form the polysilicon strip 106 and the hard mask strip 108. In certain embodiments, the stack structures 110 function as the dummy strips, which define the locations of the subsequently formed replacement gate structures.

Figure 1D:
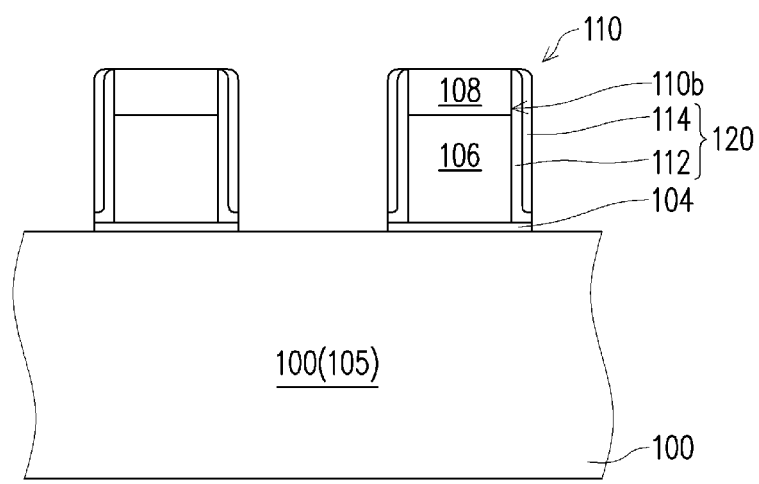

Referring to FIG. 1D, spacers 120 are formed on sidewalls 110b of the stack structures 110. In some embodiments, the spacers 120 includes first spacers 112 located on the sidewalls 110b of the stack structures 110 and second spacers 114 located on the first spacers 112. For example, the spacers 120 are formed by depositing a first spacer material (not shown) and a second spacer material (not shown) sequentially on the pad layer 110 and are formed as blanket layers over the substrate 100, conformally covering the protruded portions 105b of the fins 105 and the stack structures 110. That is, the first spacer material and the second spacer material at least cover the top surfaces and sidewalls 110b of the stack structures 110 and cover the top surfaces and sidewalls of the protruded portions of the fins 105 that are not covered by the stack structures 110. Later, a selective etching process is performed to remove portions of the first spacer material and the second spacer material so as to form the first spacers 112 and the second spacers 114 on the sidewalls 110b of the stack structures 110. In certain embodiments, as shown in FIG. 1D, the individual spacer 120 surrounding the stack structure 110 is a two-layered structure including the first spacer 112 (e.g. a seal spacer) and the second spacer 114 (e.g. an offset spacer). In some embodiments, the materials of the first spacer material and the second spacer material are different. The materials of the first spacer material and the second spacer material may include silicon nitride, silicon oxide, silicon oxynitride, silicon carbon oxynitride (SiCON), silicon carbonitride (SiCN) or combinations thereof. Although the spacers 120 are described to include two layers of dielectric materials in certain embodiments of the present disclosure, the spacers 120 may include more dielectric layers in other embodiments of the present disclosure.

During the selective etching process, in certain embodiments, the first spacer 112 is formed directly on the sidewalls 110b of the stack structure 110 (on the sidewalls of the hard mask strip 108 and the polysilicon strip 106) and the second spacer 114 is formed directly on the first spacer 112 by selectively removing the first spacer material and the second spacer material on the top surface of the stack structure 110 and leaving the first spacer material and the second spacer material remained on the sidewalls 110b of the stack structure 110 to become the first and second spacers 112, 114. In some embodiments, the selective etching process includes an anisotropic etching process such as reactive ion etching (RIE) or atomic layer etching (ALE). In some embodiments, during the selective etching process, the first spacer material and the second spacer material located on the exposed fins 105 (where the fins are not covered by the stack structures) are removed. In one embodiment, the optionally formed pad layer 104 on the exposed fins 105 is removed during the selective etching process, leaving the pad layer 104 located between the stack structures 110 and the fins 105. In some embodiments, the remained pad layer 104 is located between the spacers 120 and the fins 105. Specifically, the pad layer 104 is sandwiched between the stack structures 110 and the fins 105 and sandwiched between the spacers 120 and the fins 105.

Figure 1E:
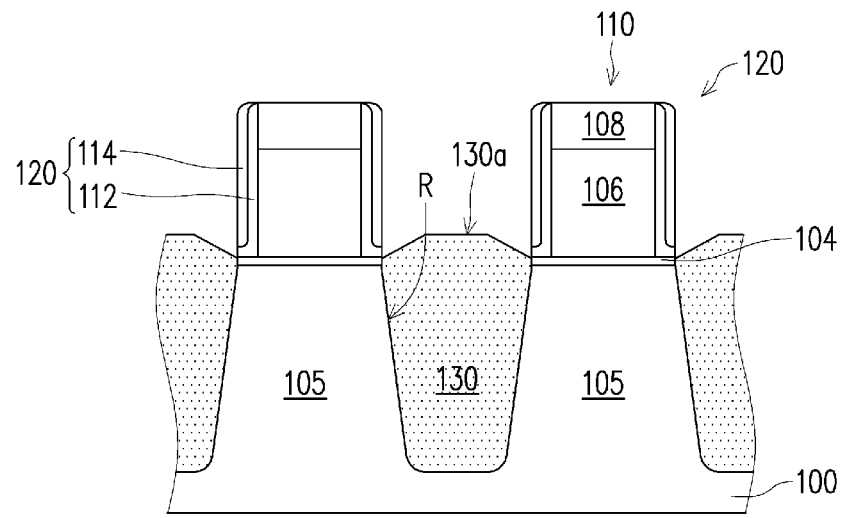

In FIG. 1E, in certain embodiments, source and drain regions 130 of the transistor are formed on the fins 105 at opposite sides of the stack structures 110 and outside the spacers 120. In one exemplary embodiment as shown in FIG. 1E, the source/drain regions 130 are disposed in recesses R of the fins 105. Following the removal of the pad layer 104, the first spacer material and the second spacer material located on the fins 105, the fins 105 that are not covered by the stack structures 110 and the spacers 120 are exposed. Using the remained spacers 120 and the stack structures 110 as the masks, the upper portions of the fins 105 are removed to form recesses R in the fins 105 and between the second spacers 120. In some embodiments, the source and drain regions 130 are further epitaxially grown and filled in the recesses R in each fin 105. It should be noted that the source and drain regions 130 may be formed as a single-layered structure or a multi-layered structure with different layers having different degrees of doping.

In certain embodiments, the formation of the recesses R includes performing a recessing process to the fins 105, so that the fins 105 located beside the stack structure 110 (not covered by the stack structure 110) and between the second spacers 130 are removed and recessed. In some embodiments, the recessing process includes an anisotropic etching process such as reactive ion etching (RIE). For example, one or more etchants may be used and the etchant(s) of the anisotropic etching process may be adjusted or changed for suitable etching selectivity. In certain embodiments, the recessing process includes using sulfur hexafluoride as the etchant for etching silicon. In one embodiment, the bottom surface of the recess(es) in the fins 105 is located above the top surface of the isolation structure(s) 102. In an alternative embodiment, bottom surface of the recess(es) in the fins 105 is located substantially coplanar with the top surface of the isolation structure(s) 102.

Figure 1F:
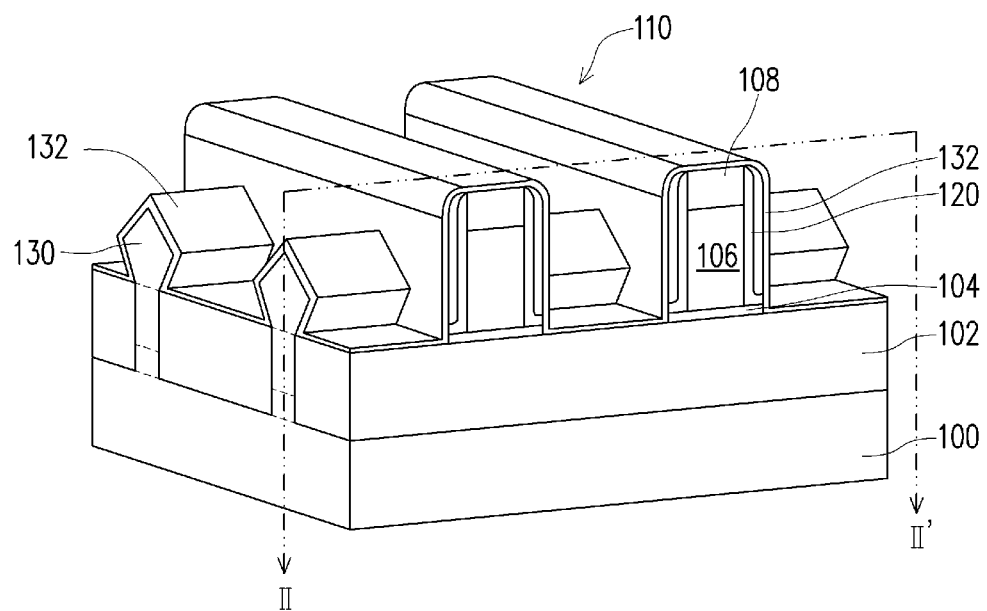

In some embodiments, as shown in FIG. 1E and FIG. 1F, the source and drain regions 130 protrude with respect to the isolation structures 102. That is, the upper surface 130a of the source or drain region 130 is higher than the top surface of the isolation structure 102. In some embodiments, the source and drain regions 120 may be epitaxially grown to have protruded shapes or diamond shapes. In some embodiments, the upper surface 130a of the source or drain region 130 may be raised or higher with respect to the adjacent channel portions of the fins 105. For example, the source and drain regions 130 are formed through epitaxial growth technology, such as cyclic deposition-etch (CDE) epitaxy or selective epitaxial growth (SEG), to form the strained material of high crystal quality. In some alternative embodiments, the strained material may include SiC, SiP, SiCP or a combination thereof. In some embodiments, a material of the source and drain regions 130 is different than a material of the fin 105. For example, a material of the source and drain regions 130 includes an epitaxial material or epitaxy material doped with a conductive dopant. Since the lattice constant of the epitaxy material or the in-situ doping epitaxy material grown in the recesses R is different from the material of the fins 105, the channel region(s) sandwiched between the source/drain regions is strained or stressed to increase carrier mobility of the device and enhance the device performance.

In alternative embodiments, the source and drain regions 130 may be epitaxially grown on the exposed fins 105 without recessing the fins 105.

Figure 1G:
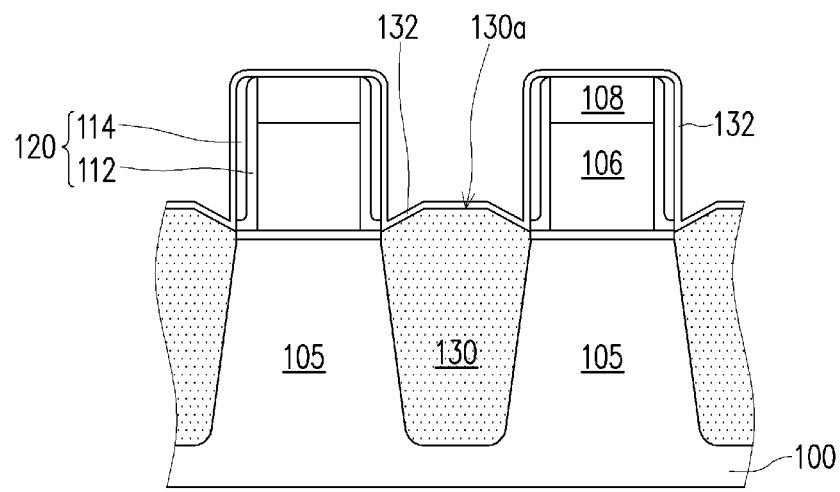

FIG. 1F shows a schematic perspective view of the structure produced using the manufacturing method of a FinFET according to some embodiments of the present disclosure. The cross-sectional view of FIG. 1G is taken along the line II-II' shown in FIG. 1F. In FIG. 1F and FIG. 1G, an etch stop layer 132 is formed over the semiconductor substrate 100. In some embodiments, the etch stop layer 132 is blanketly formed over the stack structures 110, the spacers 120, the source and drain regions 130 and the isolation structures 120. In some embodiments, the etch stop layer 132 extends over the opposing spacers 120 and covers the top surfaces 130a of the source and drain regions 130. The etch stop layer 132 may comprise a dielectric material such as silicon carbide, silicon nitride, silicon oxynitride, or the like. The etch stop layer 132 may be formed by chemical vapor deposition (CVD), atomic layer deposition (ALD), or other applicable deposition methods.

Figure 1H:
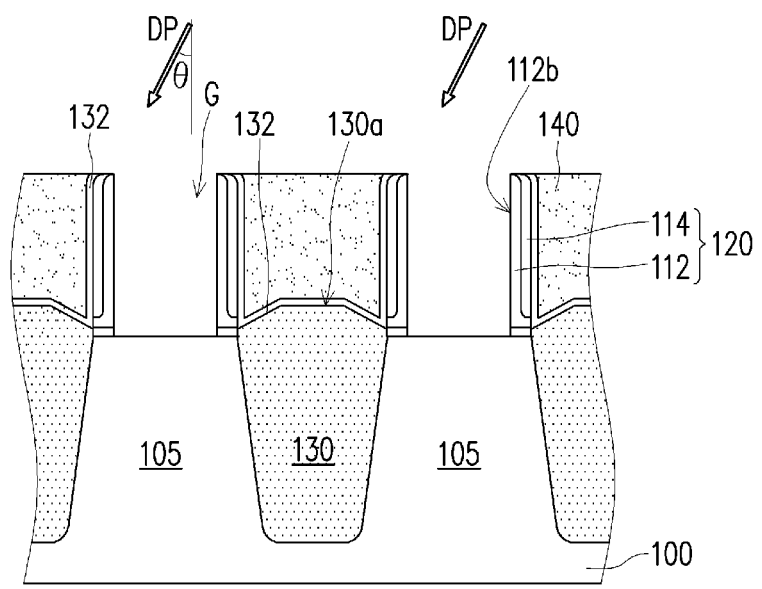
Figure 1H:
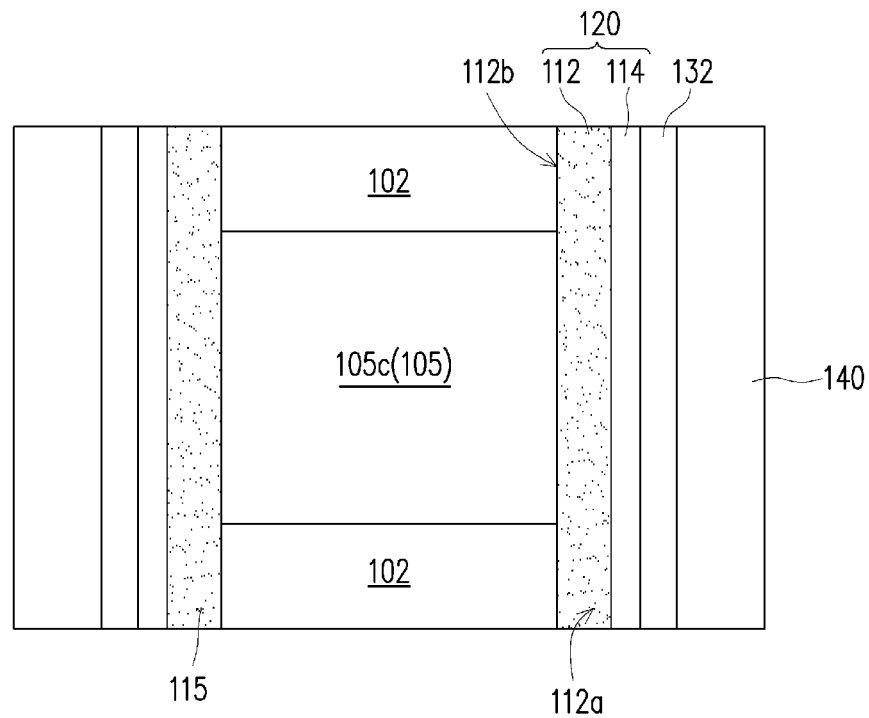

Referring to FIG. 1H, a first interlayer dielectric (ILD) layer 140 is formed on the etch stop layer 132 over the source and drain regions 130 and the isolation structures 102. The first ILD layer 140 covers the source and drain regions 130 and surrounds the spacers 120 and the stacked structures 110. In other words, the first ILD layer 140 is formed filling up the spaces between the opposing spacers 120, outside of the spacers 120 and covering the source and drain regions 130 and the isolation structures 102. In some embodiments, a material of the first ILD layer 140 includes low-k dielectric materials. Examples of low-k dielectric materials include BLACK DIAMOND®, SILK®, hydrogen silsesquioxane (HSQ), fluorinated silicon oxide (SiOF), amorphous fluorinated carbon, parylene, BCB (bis-benzo-cyclobutenes), flare, or a combination thereof. It is understood that the first ILD layer 140 may include one or more dielectric materials or one or more dielectric layers. In some embodiments, the first ILD layer 140 is formed to a suitable thickness by flowable CVD (FCVD), CVD, HDPCVD, SACVD, spin-on coating, or other suitable methods. For example, an interlayer dielectric material layer (not shown) may be initially formed to cover the isolation structures 102, the source and drain regions 130, the spacers 120, and the stack structures 110 sandwiched between the spacers 120, and then an etching or polishing process is performed to reduce the thickness of the interlayer dielectric material layer until top surfaces of the spacers 120 (or the hard mask strips 108 of the stack structures 110) are exposed, so as to form the first ILD layer 140. As seen in FIG. 1H, the first ILD layer 140 is sandwiched between the facing spacers 120 and located on the etch stop layer 132 on the source and drain regions 130. In some embodiments, the top surfaces of the spacers 120 are substantially flush with the top surface of the first ILD layer 140.

Referring to FIG. 1H, after the formation of the first ILD layer 140, the exposed stack structures 110 are removed. In one embodiment, the stack structures 110 including the polysilicon strips 106 and the hard mask strips 108 located on the polysilicon strips 106 are removed but the spacers 120 are remained. For example, the removal of the stack structures 110 includes performing an anisotropic etching process having etching selectivity toward the stack structures 110 over the spacers 120. In some embodiments, following the removal of the stack structures 110, the underlying pad layer 104 is further removed to expose the channel portions 105c of the fins 105 and the isolation structures 102.

Figure 2A:
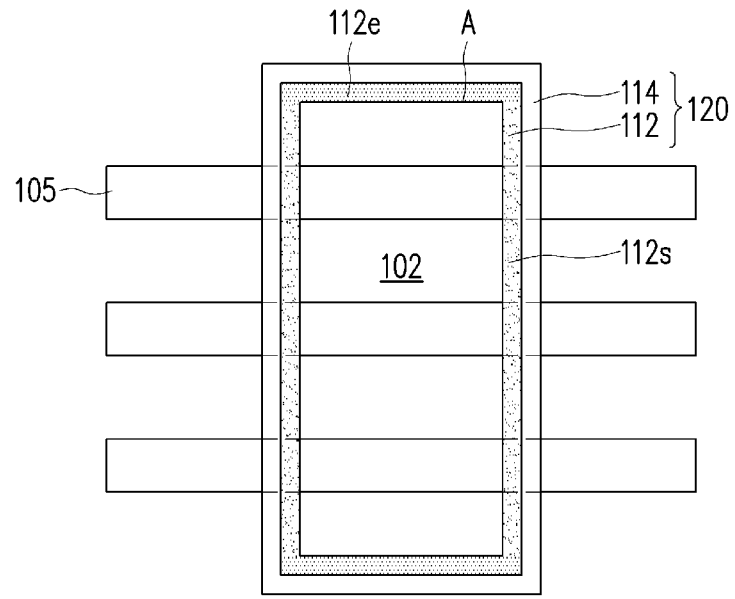
FIG. 2A and FIG. 2B show schematic top views of exemplary structures produced following the manufacturing method of a FinFET according to some embodiments of the present disclosure.
Figure 2B:
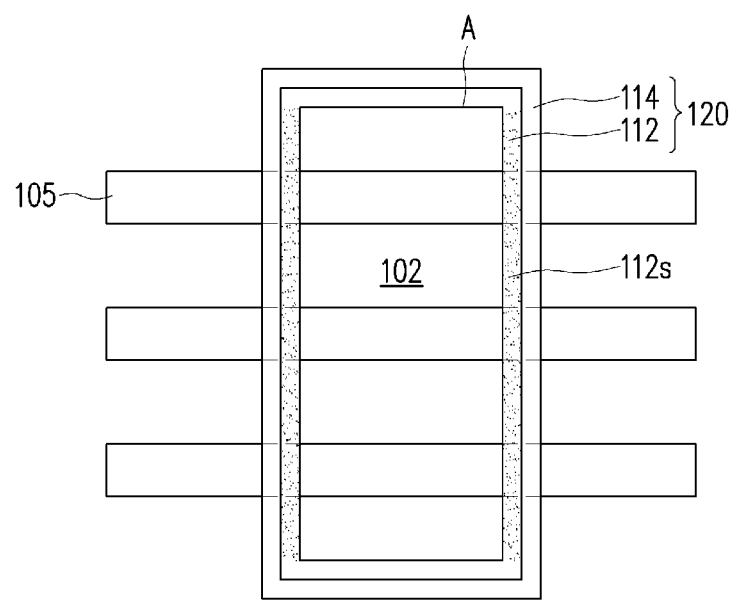

FIG. 1H' shows a schematic top view of a portion of the structure of FIG. 1H. FIG. 2A and FIG. 2B show schematic top views of exemplary structures produced after the removal of the stack structures 110 according to some embodiments of the present disclosure. In FIG. 2A and FIG. 2B, the relative positions of the spacers 120 and the fins 105 are shown, and the etch stop layer 132 and the first ILD layer 140 are omitted for illustration purposes. Referring to FIG. 1H and the top view of FIG. 1H', it is seen that a gap G is formed at the location where was previously occupied by the stack structure 110, and the channel portion 105c (i.e. channel region) of the fin 105 and isolation structures 102 are exposed. As the stack structure 110 is removed, inner sidewalls 112b of the first spacer(s) 112 located at the opposite two parallel sides of the stack structure 110 are exposed. Referring to FIG. 2A, in some embodiments, the spacer 120 surrounds the strip-shaped stack structure 110 and connects at opposite line-ends of the stack structure 110 and forms a ring structure or an enclosed wall structure defining the enclosure A in which the channel portions 105c of the fins 105 and the isolation structures 102 are exposed. Specifically, the top surface 112a and inner sidewalls 112b of the first spacers 112 are exposed after removing the stack structures 110. Later, a doping process DP is performed to the first spacers 112, implanting dopants 115 into the first spacers 112. In certain embodiments, the doping process DP is performed with a tilt angle θ, and the tilt angle θ ranges from about 0.5 degrees to about 20 degrees (relative to the vertical direction). By performing the doping process with a tilt angle, the dopants are implanted particularly into the first spacers 112, without doping the exposed fins 105 or the isolation structures 102. In some embodiments, the dopants 115 are mainly implanted into the first spacers 112 without entering into the second spacers 114.

It should be noted that whilst in FIG. 2A or FIG. 2B only three fins 105 are shown to be comprised within the enclosure A, the disclosure is not limited by the number of fins 105 encircled by the spacers 120. In some alternative embodiments, more or fewer fins 105 may be exposed within the same enclosure A. The enclosure A may be formed by removing the dummy stack structure 110 formed during previous processes. Although not shown, the source and drain regions 130 are located outside of the enclosure A defined by the spacers 120. It should be noted that whilst in FIG. 2A or FIG. 2B, only one enclosure A (subsequently gate structure formed therein) is shown, but more than one enclosure A (i.e. more than one gate structure) may be formed over multiple fins.

As shown in FIG. 1H', the implanted dopants 115 are well distributed within the first spacers 112. In some embodiments, the doping process includes implanting dopants by performing an ion implantation process or a plasma implantation process. In some embodiments, the dopants 115 may be fluorine-containing dopants or fluorine dopants. In one embodiment, the dopants 115 includes $BF_3$. In one embodiment, the dopants 115 includes $SiF_3$. For example, the doping source for the fluorine-containing dopants includes fluorine-containing gases such as fluorocarbons (such as $CHF_3$, $CF_4$ or $C_2F_6$), borocarbon compounds (such as $BF_3$), or fluorosilanes (such as $SiF_4$) or the mixtures thereof. In certain embodiments, a doping amount of fluorine in the fluorine-doped first spacer 112 is less than 5% (atoms percent). Depending on the material of the spacer structure, the type of dopants may be adjusted. In one embodiment, the material of the first spacer 112 includes silicon oxide and the dopants are fluorine dopants. By incorporating the fluorine dopants into the first spacer 112, the fluorine-doped silicon oxide film is obtained, more Si—F bonding is generated to replace Si—O bonding and the dielectric constant of the first spacer 112 can be significantly reduced. As the dielectric constant of the first spacer 112 that is located between the second spacer 114 and the subsequently formed metal gate becomes lower, the gate-to-contact capacitance becomes decreased, leading to lower parasitic capacitance for ring oscillator speed boost and better device performance. Comparing the FinFET structure having the fluorine-doped spacer with the FinFET structure having the non-doped spacer, it is found that the gate effective capacitance has been reduced by about 3%-10%.

In some embodiments, as seen in FIG. 2A, the dopants are implanted into the whole ring structure of the first spacer 112. That is, the first spacer 112 located at opposite line-ends of the enclosure A (i.e. line-end portions 112e) are doped with the dopants, while the first spacer 112 located at opposite sides of the enclosure A (i.e. lateral portions 112s) are also doped. In one embodiment, the line-end portions 112e are doped with a first doping amount while the lateral portions 112s are doped with a second doping amount that is different from the first doping amount. In some embodiments, as seen in—FIG. 2B, only the lateral portions 112s of the first spacer 112 are doped with dopants. In some embodiments, as shown in FIG. 2A and FIG. 2B, the first spacer 112 is doped, while the second spacer 114 is not doped.

Figure 2C:
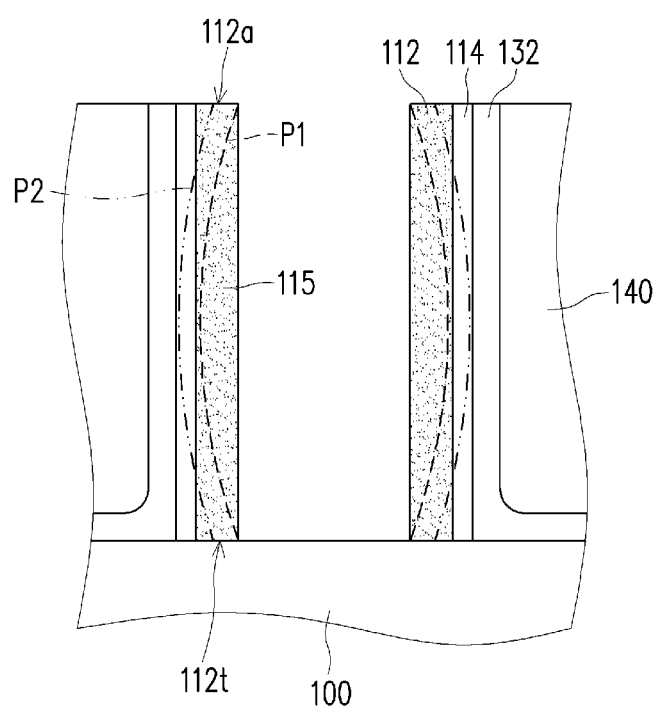
FIG. 2C shows a schematic cross-sectional view of a portion of the spacer structure according to some embodiments of the present disclosure.

FIG. 2C shows a schematic cross-sectional view of a portion of the spacer structure according to some embodiments of the present disclosure. Similar to the structure of the spacer 120 in FIG. 2A, the whole ring structure of the first spacer 112 of the spacer 120 is doped with dopants 115. However, from the cross-sectional view, the dopants 115 are distributed in the first spacers 112 with a specific distribution profile (represented by the dashed line P1). In one embodiment, more dopants 115 are present in the middle portion(s) of the first spacer 112 while less dopants 115 are present in the top and bottom portions of the first spacer 112. That is, from the top surface 112a or bottom surface 112t approaching the middle portion of the first spacer 112, the dopant content keeps increasing based on the distribution profile P1. After the doping process, one or more reflow processes may be performed, and some dopants may be driven into the second spacer 114 with a distribution profile (represented by the semi-dashed line P2). Similarly, as shown for the profile P2, more dopants 115 are present in the middle portions of the spacer 120 while less dopants 115 are present in the top and bottom portions of the spacer 120. Due to the existence of the etch stop layer 132, the dopants shall not be diffused into the first ILD layer 140. That is, the etch stop layer 132 is not dopant-doped (e.g. not fluorine-doped).

Figure 1I:
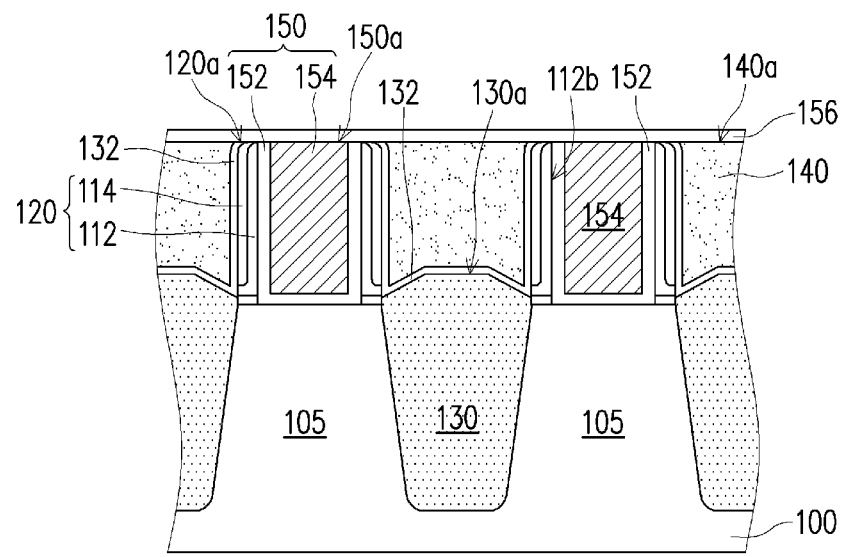

Referring to FIG. 1I, in some embodiments, subsequent to the doping process of the spacers 120, gate structures 150 are formed in the gaps G (see FIG. 1H) between the spacers 120 (e.g. within the enclosure A of FIG. 2A). In some embodiments, each of the gate structures 150 includes a gate dielectric layer 152 covering the gap G and a gate electrode 154 located on the gate dielectric layer 152 and filling the gap G. In some embodiments, the gate dielectric layer 152 is formed by blanketly forming a dielectric stack layer (not shown) over exposed fins 105 and the isolation structures 102 disposed in between the fins 105 in the gaps G (within the enclosure A). In some embodiments, the dielectric stack layer extends within the enclosure A, and further extends over the spacers 120 and the first ILD layer 140 outside of the enclosure A. In some embodiments, the dielectric stack layer contacts the fins 105 and the isolation structures 102 within the enclosure A, and further contacts the inner sidewalls 112b of the first spacer 112 and the top surface of the first ILD layer 140. Later, a gate electrode material (not shown) is formed over the dielectric stack layer, and a planarization process is performed to remove the dielectric stack layer and the gate electrode material outside of the gap G (outside of the enclosure A) so as to form the gate dielectric layer 152 and the gate electrode 154 located between the spacer(s) 120. In some embodiments, the gate structures 150 enclosed by the spacers 120 are replacement gate structures. In some embodiments, the planarization process includes performing a chemical mechanical polishing (CMP) process or an etching back process. As shown in FIG. 1I, following the planarization process, the top surface 120a of the spacers 120 may be substantially flush with the top surface 150a of the gate structure 150, and the top surface 140a of the first ILD layer 140. In some other embodiments, the gate structure 150 may further include additional barrier layers, multiple work function layers, adhesion layers, or the like. After the planarization process, a barrier layer 156 is blanketly formed over the first ILD layer 140, the spacers 120 and the gate structures 150.

In some embodiments, the dielectric stack layer is formed by sequential deposition of multiple layers of a gate dielectric material (not shown) and a work function material (not shown), and followed by blanketly forming the gate electrode material on the work function material and filling up the gaps G enclosed by the spacers 120. In some embodiments, the method of forming the gate dielectric material or the work function material includes performing at least one suitable deposition process, such as chemical vapor deposition (CVD), plasma-enhanced CVD, metal oxide chemical vapor deposition (MOCVD), ALD, plasma-enhanced atomic layer deposition (PEALD), molecular beam deposition (MBD), or the like.

In some embodiments, the gate dielectric material includes a high-k material has a dielectric constant greater than about 4, greater than about 12, greater than about 16, or even greater than about 20. For example, the high-k material may include metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, or a combination thereof, or other suitable materials. In some alternative embodiments, the high-k material may optionally include a silicate such as HfSiO, HfSiON LaSiO, AlSiO, or a combination thereof. In some embodiments, the work function material may be selected according to the conductivity type desired for the transistor. Exemplary p-type work function materials that may be included in the work function material layer 520a include TiN, TaN, Ru, Mo, Al, WN, $ZrSi_2$, $MoSi_2$, $TaSi_2$, $NiSi_2$, WN, other suitable p-type work function materials, or combinations thereof. On the other hand, exemplary n-type work function materials that may be included in the work function material layer 520a include Ti, Ag, TaAl, TaAlC, TiAlN, TaC, TaCN, TaSiN, Mn, Zr, other suitable n-type work function materials, or combinations thereof.

In some embodiments, the gate electrode material includes titanium (Ti), tantalum (Ta), tungsten (W), aluminum (Al), zirconium (Zr), hafnium (Hf), titanium aluminum (TiAl), tantalum aluminum (TaAl), tungsten aluminum (WAl), zirconium aluminum (ZrAl), hafnium aluminum (HfAl), titanium nitride (TiN), tantalum nitride (TaN), titanium silicon nitride (TiSiN), tantalum silicon nitride (TaSiN), tungsten silicon nitride (WSiN), titanium carbide (TiC), tantalum carbide (TaC), titanium aluminum carbide (TiAlC), tantalum aluminum carbide (TaAlC), titanium aluminum nitride (TiAlN), tantalum aluminum nitride (TaAlN), any other suitable metal-containing material, or a combination thereof. In some embodiments, a material of the barrier layer includes silicon nitride.

Figure 1J:
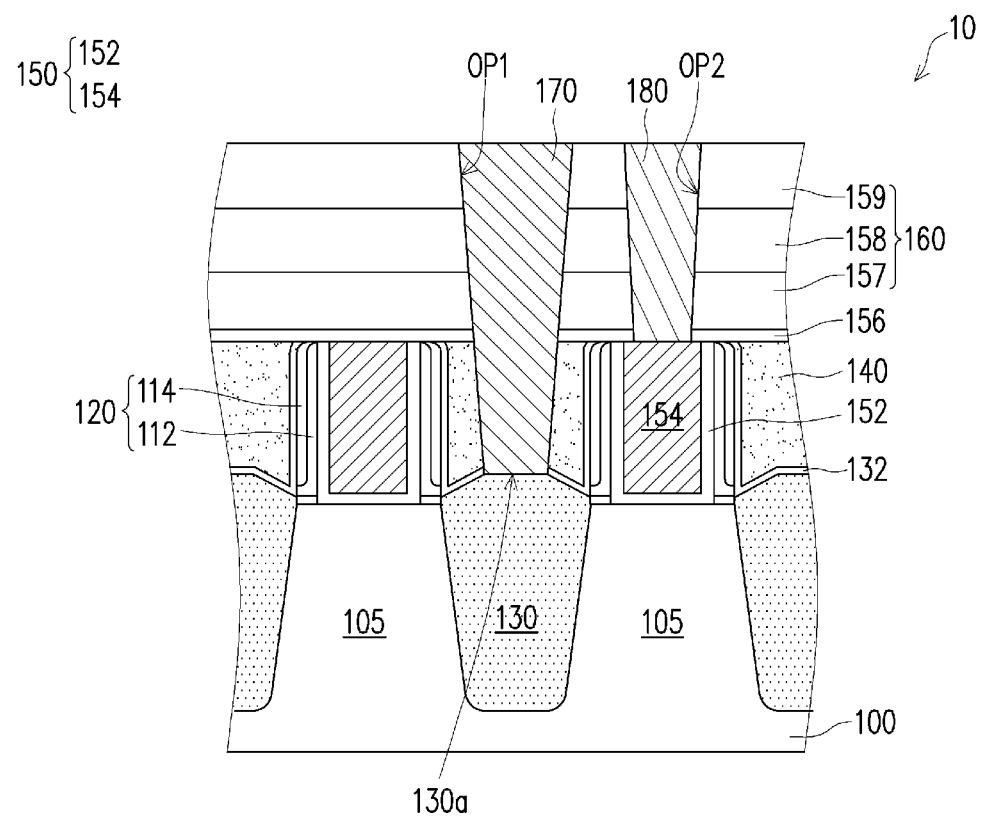

Referring to FIG. 1J, a second ILD layer 160 is formed covering the barrier layer 156 and over the gate structures 150 and the first ILD layer 140. In FIG. 1J, three stacked dielectric layers 157, 158, 159 are sequentially formed over the barrier layer 156 and the gate structures 150. In some embodiments, the materials of these dielectric layers 157, 158, 159 are all different or partially different from one another. Although the second ILD layer 160 is shown to include three stacked dielectric layers, it is possible that the second ILD layer 160 is a single layer if the materials of these three stacked dielectric layers are the same. In some embodiments, the material(s) of the second ILD layer 160 includes a low-k dielectric material. The second ILD layer 160 is formed with methods similar to what previously discussed for the first ILD layer 140, and a detailed description is omitted herein. In some embodiments, the material of the second ILD layer 160 is different from the material of the first ILD layer 140 or the material of the barrier layer 156. In some embodiments, selective etching is possible between the second ILD layer 160 and the barrier layer 156.

Referring to FIG. 1J, one or more contacts 170 are formed for connecting the source and drain regions 130 and one or more contacts 180 are formed for connecting with the gate structure(s) 150. As shown in FIG. 1J, in some embodiments, the source/drain contacts 170 are formed on the source and drain regions 130 penetrating through the first and second ILD layers 160, 140 and the barrier layer 156. For example, first openings OP1, extending through the first and second ILD layers 160, 140 and the barrier layer 156, may be formed by performing an etching process using the etch stop layer 132 as the etch stop layer, to expose the source and drain regions 130. A conductive material may then be filled within the first opening OP1 to form the source/drain contact 170 contacting the top surface 130a of the source and drain regions 130. In certain embodiments, the source/drain contact(s) 170 may be formed as two or multi-tiered contact structure. As shown in FIG. 1J, in some embodiments, one or more gate contacts 180 are formed on the gate structure(s) 150 penetrating through the second ILD layer 160 and the barrier layer 156. For example, second openings OP2 are formed extending through the second ILD layer 160 and the barrier layer 156 to expose the gate electrode 154, and a conductive material may then be filled within the opening OP2 to form the gate contact 180 contacting the top surface of the gate electrode 154. The conductive material for the contact 170 or 180 may include cobalt (Co), tungsten (W), copper (Cu), titanium (Ti), tantalum (Ta), aluminum (Al), zirconium (Zr), hafnium (Hf), or other suitable metals. In some embodiments, the conductive material for the contacts 170 or 180 may be cobalt, tungsten or copper. In some embodiments, the conductive material may be formed by using sputtering, chemical vapor deposition (CVD), physical vapor deposition (PVD), atomic layer deposition (ALD), other deposition techniques, or a combination thereof. In some embodiments, a planarization process may be performed to planarize the contacts 170, 180 and the second ILD layer 160. It is understood that the number of contacts or the position of the contacts may be varied according to production and design requirements.

In some embodiments, as shown in FIG. 1J, the spacer(s) 120 of the FinFET structure 10 may include at least one fluorine-doped first spacer 112 located between the gate structure 150 and the source/drain contact 170. Owing to the low dielectric contact of the fluorine-doped first spacer 112 located between the gate structure 150 and the source/drain contact 170, the gate-to-contact parasitic capacitance becomes smaller and the device performance is improved.

According to some embodiments, a field effect transistor including a substrate, fins, a gate structure, a first spacer and a second spacer is disclosed. The fins protrude from the substrate and extend in a first direction. The gate structure is disposed across and over the fins and extends in a second direction perpendicular to the first direction. The first spacer is disposed on sidewalls of the gate structure. The second spacer is disposed on the first spacer and surrounds the gate structure. The first spacer is fluorine-doped and includes fluorine dopants.

According to some embodiments, a field effect transistor including a substrate, fins, isolation structures, a gate structure, a spacer structure and source and drain regions is disclosed. The fins are arranged in parallel over the substrate, and the isolation structures are disposed between the adjacent fins. The gate structure is disposed over the fins and on the isolation structures. The spacer structure is disposed on two pairs of opposite sidewalls of the gate structure and surrounds the gate structure. The spacer structure has an inner spacer disposed on the sidewalls of the gate structure and an outer spacer disposed on the inner spacer and the inner spacer has a fluorine content higher than that of the outer spacer. The source and drain regions are disposed at opposite sides of the gate structure.

According to some embodiments, a method of manufacturing a field effect transistor includes at least the following steps. Fins are formed over a substrate and isolation structures are formed between the adjacent fins. A stack structure is formed over the fins and on the isolation structures. A spacer structure is formed on the sidewalls of the stack structure and around the stack structure. An interlayer dielectric layer is formed over the substrate covering the spacer structure and exposing the stack structure. The stack structure is removed without removing the spacer structure. A doping process is performed to inner sidewalls of the spacer structure with a tilt angle ranging from about 0.5 degrees to 20 degrees. A gate structure is formed between the spacer structure.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A field effect transistor, comprising:
   a substrate;
   fins, protruding from the substrate and extending in a first direction;
   a gate structure, disposed across and over the fins and extending in a second direction perpendicular to the first direction;
   a first spacer, disposed on sidewalls of the gate structure;
   a second spacer, disposed on the first spacer and surrounding the gate structure; and
   an etch stop layer, disposed on and extending over the second spacer and covering the second spacer and the substrate, wherein the first spacer is fluorine-doped and includes fluorine dopants, and
   wherein the second spacer has fluorine dopants mainly located in a mid-section of the second spacer.

2. The field effect transistor of claim 1, wherein a content of the fluorine dopants in the first spacer is higher than a content of the fluorine dopants in the second spacer.

3. The field effect transistor of claim 1, wherein the etch stop layer is not fluorine-doped.

4. The field effect transistor of claim 1, wherein a material of the first spacer is different from that of the second spacer.

5. The field effect transistor of claim 1, wherein a material of the second spacer is different from that of the etch stop layer.

6. The field effect transistor of claim 1, wherein first portions of the first spacer are fluorine-doped with a first doping amount and second portions of the first spacer are fluorine-doped with a second doping amount that is different from the first doping amount.

7. The field effect transistor of claim 1, wherein first portions of the first spacer are fluorine-doped and second portions of the first spacer are not fluorine-doped.

8. The field effect transistor of claim 1, wherein a whole structure of the first spacer is fluorine-doped.

9. A field effect transistor, comprising:
   a substrate;
   fins, arranged in parallel over the substrate;
   isolation structures, disposed between the adjacent fins;
   a gate structure, disposed over the fins and on the isolation structures;
   a spacer structure, disposed on two pairs of opposite sidewalls of the gate structure and surrounding the gate structure, wherein the spacer structure has an inner spacer disposed on the sidewalls of the gate structure and an outer spacer disposed on the inner spacer and the inner spacer has a fluorine content higher than that of the outer spacer, and wherein the outer spacer has fluorine dopants mainly located in a mid-section of the outer spacer;
   source and drain regions, disposed at opposite sides of the gate structure; and
   an etch stop layer, disposed on and extending over the outer spacer, the isolation structures and the source and drain regions.

10. The field effect transistor of claim 9, further comprising an interlayer dielectric layer covering the source and drain regions and the spacer structure.

11. The field effect transistor of claim 10, further comprising a source and drain contact penetrating through the interlayer dielectric layer and disposed on the source and drain regions.

12. The field effect transistor of claim 10, wherein the etch stop layer is sandwiched between the interlayer dielectric layer and the isolation structures, the source and drain regions and the spacer structure.

13. The field effect transistor of claim 12, wherein the etch stop layer is not fluorine-doped.

14. The field effect transistor of claim 9, wherein a middle portion of the spacer structure has a fluorine content higher than those of top and bottom portions of the spacer structure.

15. The field effect transistor of claim 14, wherein a middle portion of the inner spacer has a fluorine content higher than those of top and bottom portions of the inner spacer.

* * * * *